United States Patent
Wu

(10) Patent No.: US 6,331,456 B1
(45) Date of Patent: *Dec. 18, 2001

(54) FIPOS METHOD OF FORMING SOI CMOS STRUCTURE

(75) Inventor: Shye-Lin Wu, Hsinchu (TW)

(73) Assignee: Texas Instruments - Acer Incorporated, Hsinchu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/072,289

(22) Filed: May 4, 1998

(51) Int. Cl.[7] .................................................. H01L 21/00
(52) U.S. Cl. ........................ 438/154; 438/409; 438/443; 438/450; 438/526
(58) Field of Search ........................... 438/154, 199, 438/225, 226, 232, 400, 294, 425, 424, 434, 443, 452, 450, 449, 439, 228, 529, 526, 149, 298, 412, 409, 426, 451

(56) References Cited

U.S. PATENT DOCUMENTS

| | | | |
|---|---|---|---|
| 4,261,761 | * 4/1981 | Sato et al. ........................... | 148/1.5 |
| 4,910,165 | * 3/1990 | Lee et al. ........................... | 438/409 |
| 5,397,734 | * 3/1995 | Iguchi et al. ...................... | 438/241 |
| 5,471,416 | * 11/1995 | Azmanov ............................ | 365/104 |
| 5,478,761 | * 12/1995 | Komori et al. .................... | 438/228 |
| 5,556,796 | * 9/1996 | Garnett et al. .................... | 438/294 |
| 5,702,976 | * 12/1997 | Schuegraf et al. ................ | 438/424 |
| 5,767,557 | * 6/1998 | Kizilyalli ........................... | 257/403 |
| 5,994,190 | * 11/1999 | Hashimoto ......................... | 438/298 |
| 6,054,368 | * 4/2000 | Yoo et al. .......................... | 438/450 |

* cited by examiner

*Primary Examiner*—Olik Chaudhuri
*Assistant Examiner*—Kurt Eaton

(57) ABSTRACT

The present invention discloses a method to form CMOS transistors for high speed and lower power applications. A high energy and low dose phosphorous is implanted in a silicon substrate to fabricate an N-well after a pad oxide layer and a silicon nitride layer is formed. After a thick field oxide is formed by using a high temperature steam oxidation process, another high energy and low dose multiple boron implantation is then performed to fabricate a buried heavily boron doped region. A rapid thermal processing (RTP) system is following used to activate the boron dopant to form buried p+ layer and to recover the implanted damages. All the field oxide films are then removed by using a diluted HF or BOE solution. After porous silicon is obtained via anodic electrochemical dissolution in the HF solution, the porous silicon is then thermally oxidized to form the separate n-type silicon islands. Next, a thick CVD oxide film is deposited and then etched back to planarize device surface. Selectively boron ion implantation is used to convert n-type silicon islands into p-type silicon islands. Finally, CMOS transistors can be fabricated on the silicon islands.

20 Claims, 4 Drawing Sheets

US 6,331,456 B1

FIPOS METHOD OF FORMING SOI CMOS STRUCTURE

BACKGROUND OF THE INVENTION

1. Field of the Invention

The invention relates to a method for fabricating CMOS transistors in semiconductor devices, and more particularly, to a method for fabricating the isolation regions for SOI (Silicon-On-Insulator) CMOS transistors.

2. Description of the Prior Art

In the present days, silicon-on-insulator (SOI) structures are recognized as an ideal configuration to fabricate CMOS transistors. The SOI technology offers many advantages, such as applying a simpler fabrication sequence and resultant cross-section compared to circuits fabricated on bulk silicon. In addition, the SOI scheme also provides reduced capacitive coupling between various circuit elements over the entire IC (integrated circuit) chip, and in CMOS circuit latchup is eliminated. SOI still reduces the size and/or increases packing density that will increase the circuit speed. Finally, a minimum device separation is determined only by the limitations of lithography.

Although, the SOI technology can significantly reduce process complexity and thus improve the operation speed (referring to the article disclosed by M. Alles et al. and titled "Thin film silicon on insulator: an enabling technology" in Semiconductor international p. 67, 1997), however, as with all technologies, SOI structure has its own disadvantages. For example, active regions in SOI technology are poorer in crystalline quality than their counterparts in bulk silicon. In addition, the presence of an isolating substrate, or insulating layer, may complicate or prevent the adoption of effective defect- and impurity-gettering processes.

Nevertheless, SOI's potential advantages are sufficiently attractive that development work in this area remains quite active. For instance, there are several methods to form thin film SOI structure, such as separation by implanted oxygen (SIMOX) and full isolation by porous oxidized silicon (FIPOS) processes. However, there are also potential disadvantages existed in SIMOX and FIPOS technologies. For the SIMOX structure, it is difficult to recover silicon defects induced by the high energy/dose oxygen implant (referring to the overview in the IEEE Circuit and Devices Magazine p. 3, 1987, disclosed by H. T. Weaver et al.). Also, for the FIPOS method, the high quality n-epitaxial layer must be grown on p+/p− substrate or n+/n− substrate (referring to the article disclosed by L. A. Nefit et al. titled "Advanced in oxidized porous silicon for SOI" in IDEM Tech. Dig. p. 800, 1984). Further process sequences are therefore needed to overcome the above-mentioned disadvantages, which will significantly upgrade cost budget. A requirement has been arisen to disclose a process to form CMOS transistors for future high speed and lower power application with less simpler fabricating sequence and less cost budget.

SUMMARY OF THE INVENTION

Accordingly, the present invention discloses a method to form CMOS transistors for high speed and low power applications based on the FIPOS SOI technology. A high energy and low dose phosphorous is implanted in a silicon substrate to fabricate an N-well after a pad oxide layer and a silicon nitride layer is formed. After a thick field oxide is formed by using a high temperature steam oxidation process, another high energy and low dose multiple boron implantation is then performed to fabricate a buried heavily boron doped region. A rapid thermal processing (RTP) system is used to activate the boron dopant to form buried p+ layer and to recover the implanted damages. All the field oxide regions are then removed by using a diluted HF or BOE solution. After porous silicon is obtained via anodic electrochemical dissolution in the HF solution, the porous silicon is then thermally oxidized to form the separate n-type silicon islands. Next, a thick chemical vapor deposition (CVD) oxide layer is deposited and then etched back to planarize device surface. Selectively boron ion implantation is used to convert n-type silicon islands into p-type silicon islands. Finally, CMOS transistors can be fabricated on the FIPOS silicon islands.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
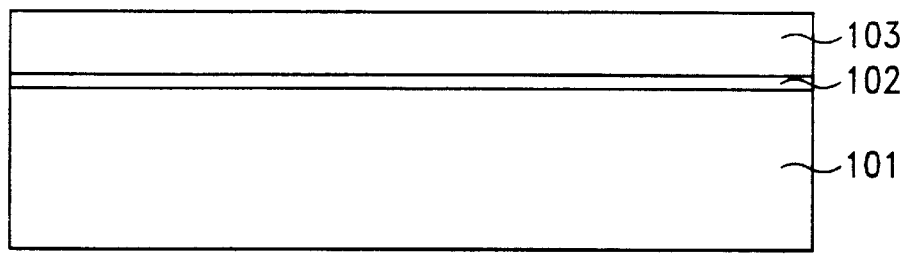
FIG. 1 is a cross section of a silicon substrate representative of when a silicon nitride layer is formed over a pad oxide layer on the silicon substrate.
Figure 2:
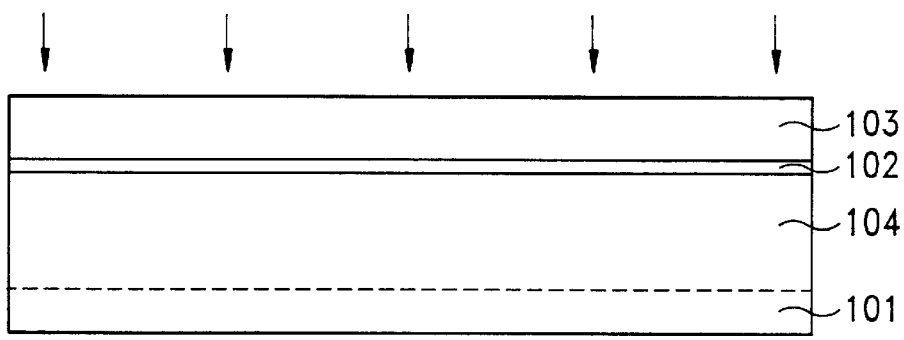
FIG. 2 illustrates a cross-sectional view of the silicon substrate representative of when phosphorous ions are implanted to form an N-well in the silicon substrate.
Figure 3:
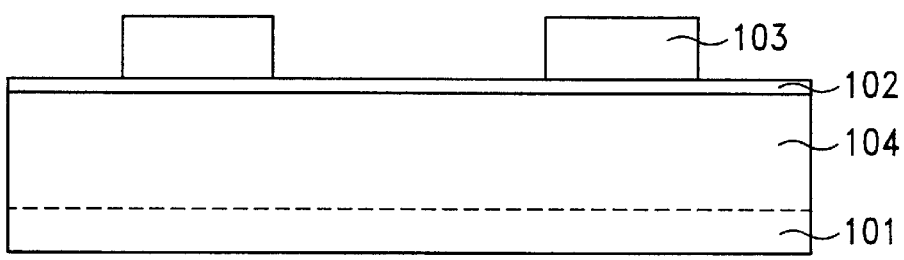
FIG. 3 represents a cross section illustrative of when the silicon nitride layer is completely patterned on the pad oxide layer.
Figure 4:
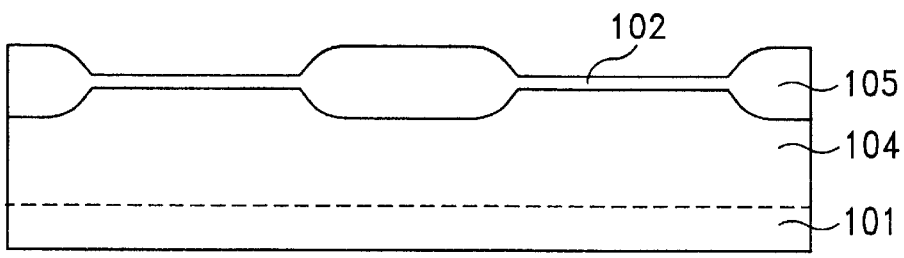
FIG. 4 demonstrates a cross section of the silicon substrate when a filed oxide layer is formed and follows by removing the patterned silicon nitride layer.

FIG. 1 is a cross section representative of when a nitride layer 103 with a thickness of about 500 to 3000 Å (angstrom) is formed over a pad oxide layer 102. The pad oxide layer 102 is composed of silicon dioxide with a thickness of about 50 to 500 Å. FIG. 2 illustrates a cross-sectional view representative of when phosphorous ions are implanted to form an N-well 104 in the silicon substrate 101. The depth of the N-well 104 is about 0.5 to 4 µm, and the implanted phosphorous ions are at an energy about 150 KeV to 3 MeV, and at a dose between 1e12 to 5e13 atoms/cm$^2$. FIG. 3 represents a cross section illustrative of when a silicon nitride layer 103 is patterned on the pad oxide layer 102. Next, the silicon nitride layer 103 is then removed after a filed oxide region 105 with a thickness about 2000 to 10000 Å is fabricated by a thermal oxidation process. FIG. 4 shows a cross section of the silicon substrate 101 after the filed oxide region 105 is formed and the silicon nitride layer 103 is completely removed.

Figure 5:
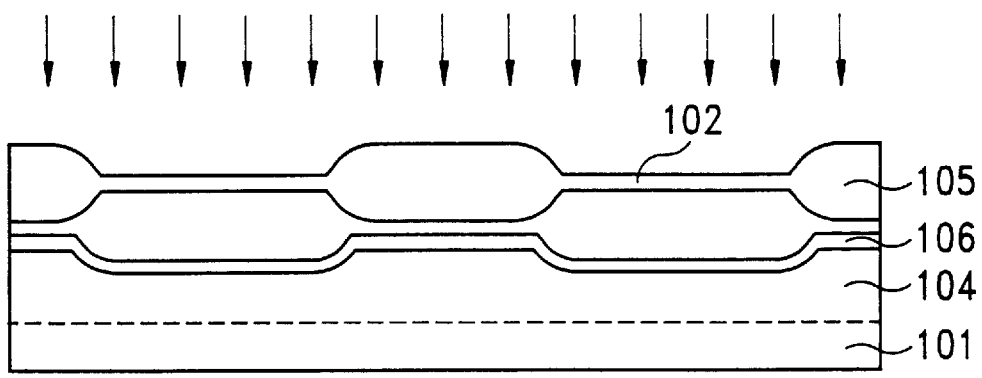
FIG. 5 shows a cross-sectional view of the silicon substrate when a high energy and low dose boron is implanted in a silicon substrate.
Figure 6:
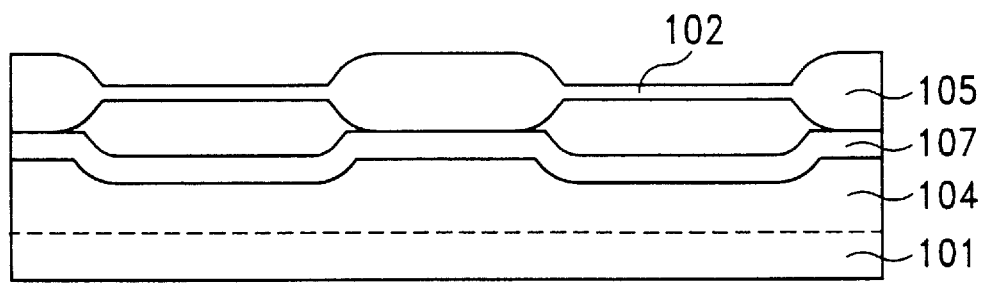
FIG. 6 is a cross-sectional view of the silicon substrate illustrative of when a RTP system is used to activate the boron dopant to form a buried p+ layer.
Figure 7:
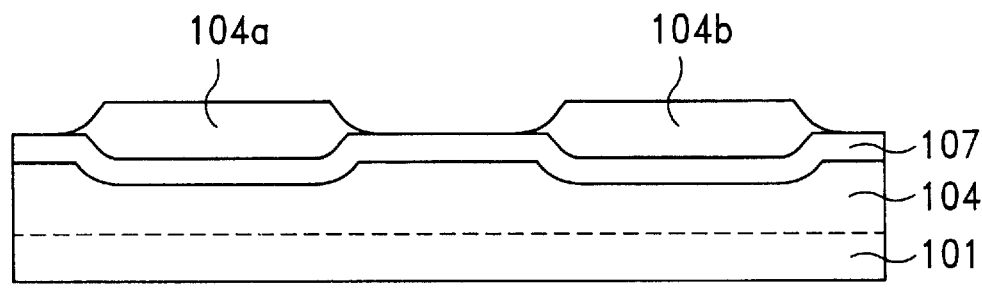
FIG. 7 shows a cross section of the silicon substrate after the field oxide regions are then removed.

FIG. 5 shows a cross-sectional view illustrative of when a high energy and low dose boron is implanted by using a dose between 5e11 to 1e15 and at an energy about 150 KeV to 3 MeV to form a buried heavily boron doped region 106 in the silicon substrate 101. Next, a RTP system is used to activate the boron dopant of the boron doped region 106 for recovering the implanted damages and then form a buried p+ layer 107. FIG. 6 represents a cross-sectional view illustrative of when the buried p+ layer 107 is completely formed. The field oxide region 105 is then removed by using a buffered oxide etching (BOE) or HF solution, and FIG. 7 shows the cross section after the field oxide region 105 is stripped.

Figure 8:
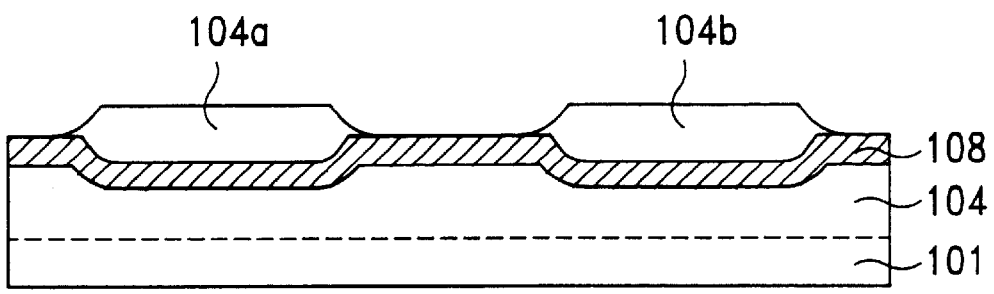
FIG. 8 depicts a cross section of the silicon substrate after the buried p+ layer is converted to a porous silicon layer.
Figure 9:
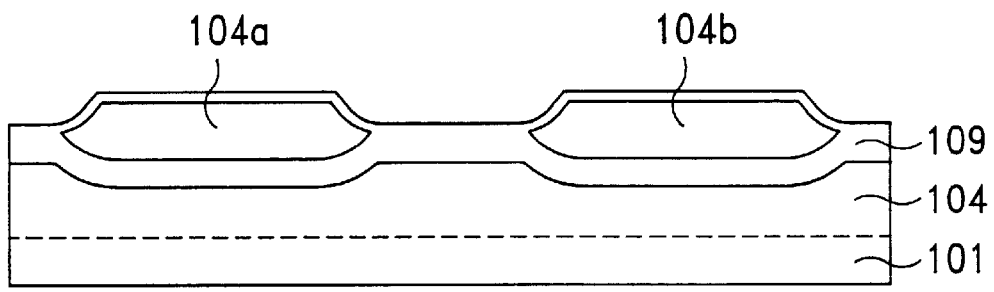
FIG. 9 represents a cross-section view of the silicon substrate when a thermal oxidation is applied to oxidize the porous silicon layer to form isolation regions and separate n-type silicon islands.

FIG. 8 depicts a cross section representative of when the buried p+ layer 107 is converted to a porous silicon layer 108 by anodization in a HF solution. Then, a thermal oxidation process is used to oxidize the porous silicon layer 108 to form isolation regions 109 and separate n-type silicon islands 104a and 104b. FIG. 9 represents a cross-section view illustrative of when the isolation regions 109 and the n-type silicon islands 104a and 104b are completely formed. Please note that the thickness of the oxidized n-type silicon 104a and 104b are thinner than the oxidized porous silicon layer 108 because the porous silicon layer 108 will be oxidized faster than both the n-type silicon islands 104a and 104b.

Figure 10:
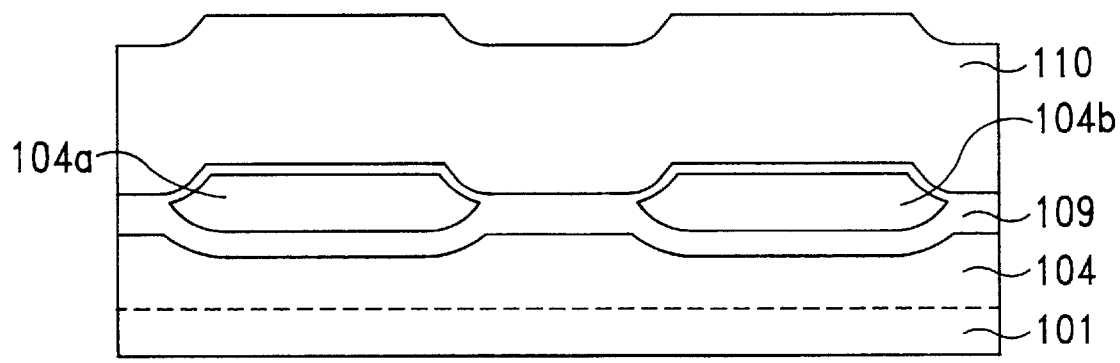
FIG. 10 illustrates a cross-section view of the silicon substrate when a thick CVD oxide layer is deposited over the surface of the silicon substrate.
Figure 11:
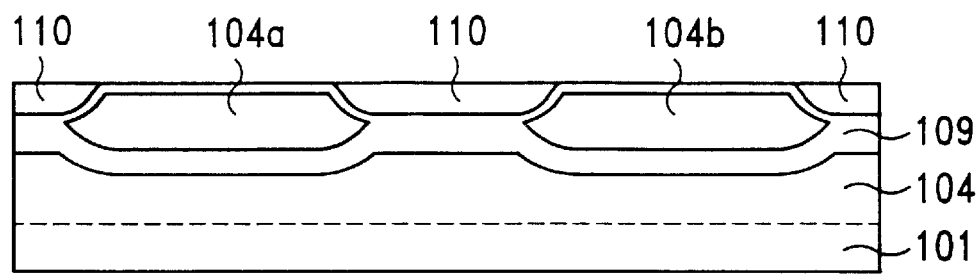
FIG. 11 displays a cross-sectional view of the silicon substrate when the thick CVD oxide layer is etched back to planarize device surface of the silicon substrate.

FIG. 10 shows a cross-sectional view illustrative of when a thick CVD oxide layer 110 is deposited along the surface of the silicon substrate 101. The thick CVD oxide layer 110 is then etched back to a planarized surface by using a chemical mechanical polishing (CMP) process. FIG. 11 displays a cross-sectional view representative of when the thick CVD oxide layer 110 is etched back to the planarized surface of the silicon substrate 101. Obviously, the above-mentioned processes are easy to achieve than the bulk processes, and the cost of FIPOS SOI technology can be reduced as compared to the conventional FIPOS scheme.

Figure 12:
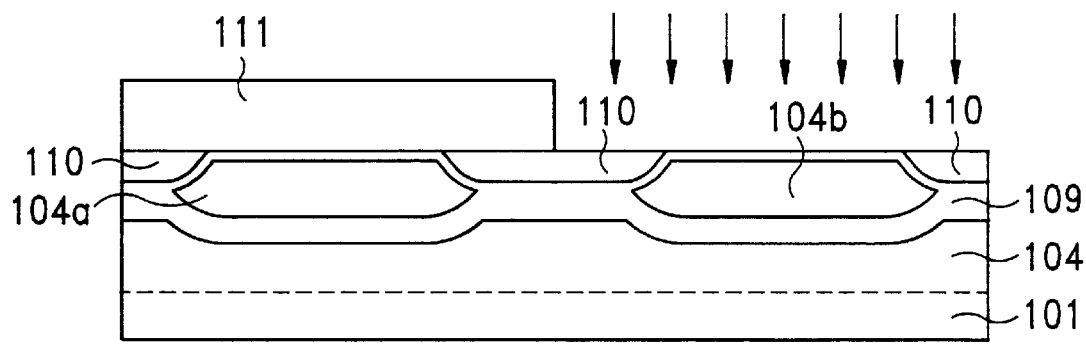
FIG. 12 demonstrates a cross section of the silicon substrate after boron ions are implanted to convert an n-type silicon islands a into p-type silicon island.
Figure 13:
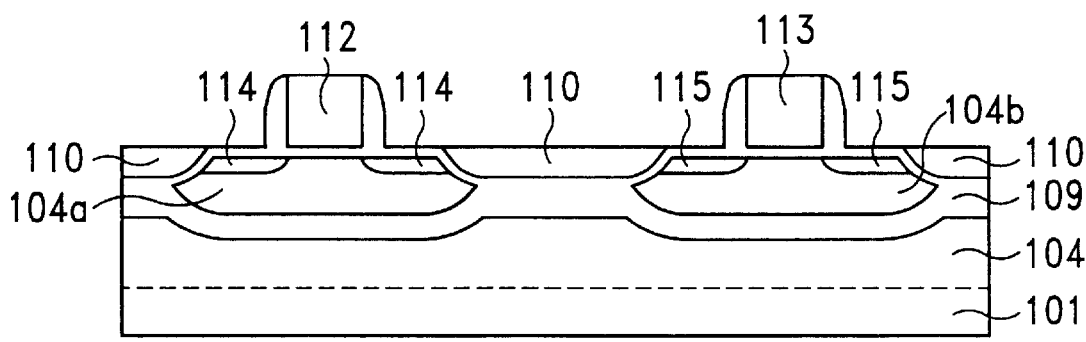
FIG. 13 is a cross section of the silicon substrate after a CMOS transistor is fabricated on the silicon islands.

Therefore, the isolation regions are completely made for semiconductor devices, and sequence processes for fabricating CMOS transistors are thus continued. For example, in FIG. 12 that shows a cross section illustrative of when boron ions are implanted to convert the n-type silicon island 104b into a p-type silicon island for fabricating a CMOS transistor. Please note that a resist 111 is necessary to mask the n-type silicon island 104a to be doped. Finally, the sequence processes for fabricating the CMOS transistor are continued, such as forming a gate structure 112, and p+ layer 114 as source and drain for the PMOSFET, and forming a gate structure 113, and n+ layer 115 as source and drain for the NMOSFET. FIG. 13 represents a cross section of the silicon substrate 101 after the CMOS transistor is fabricated.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming a silicon-on-insulator structure, said method comprising the steps of:

forming a pad oxide layer on a substrate;

forming a silicon nitride layer on said pad oxide layer;

patterning said silicon nitride layer to form an active region;

forming a field oxide layer by using said silicon nitride layer as a mask;

removing said silicon nitride layer;

performing an ion implantation to form a buried dopant layer under said field oxide layer and said active region in said substrate, wherein a portion of said buried dopant layer under said active region is deeper than a portion under said field oxide layer;

removing completely said field oxide layer to expose said portion of said buried dopant layer under said field oxide layer and a portion of said substrate in said active region;

performing an oxidation to convert said buried dopant layer into an isolation layer and form an oxide film on said portion of said exposed substrate in said active regions;

depositing an oxide layer along a surface of said oxide film and said isolation layer; and etching back said oxide layer to a planarized surface.

2. The method according to claim 1, wherein an n-type silicon layer with a thickness about 0.5 to 4 µm is implanted before patterning said silicon nitride layer.

3. The method according to claim 2, wherein said n-type silicon layer is doped phosphorous ions at an energy between about 150 KeV to 3 MeV, at a dose between about 1e12 to 5e13 atoms/cm$^2$.

4. The method according to claim 1, wherein said field oxide layer is formed by a high temperature steam oxidation process.

5. The method according to claim 1, wherein a thickness of said field oxide layer is about 2000 to 10000 Å.

6. The method according to claim 1, wherein said buried dopant layer is converted into buried porous silicon layer before converting to said isolation layer.

7. The method according to claim 6, wherein an anodization process accompanied with a diluted HF or a buffered-oxide-etching solution is applied to convert said buried dopant layer to be a buried porous silicon layer.

8. The method according to claim 6, wherein a thermal oxidation is applied to convert said buried porous silicon layer to form said isolation layer.

9. The method according to claim 1, wherein said buried dopant layer is doped boron ions at an energy between about 150 KeV to 3 MeV, at a dose between about 5e11 to 1e15 atoms/cm$^2$.

10. The method according to claim 1, wherein said step of forming said buried dopant layer comprises a step of applying a rapid thermal processing to recover implanted damages of said buried dopant layer.

11. The method according to claim 1, wherein said oxide layer is formed by using a chemical vapor deposition process.

12. A method of forming a silicon-on-insulator structure, said method comprising the steps of:

forming a pad oxide layer on a substrate;

forming a silicon nitride layer on said pad oxide layer;

patterning said silicon nitride layer;

performing an ion implantation to form an n-type silicon layer in said substrate;

forming a field oxide layer by using said silicon nitride layer as a mask;

removing said silicon nitride layer;

performing an ion implantation to form a buried dopant layer under said field oxide layer and said active region in said n-type silicon layer, wherein a portion of said buried dopant layer under said active region is deeper than a portion under said field oxide layer;

recovering implanted damages of said buried dopant layer;

removing completely said field oxide layer to expose said portion of said buried dopant layer under said field oxide layer and a portion of n-type silicon layer in said active region;

converting said buried dopant layer to be a buried porous silicon layer;

performing a thermal oxidation to convert said buried porous silicon layer to form an isolation layer and form an oxide film on said portion of said exposed n-type silicon layer;

depositing an oxide layer along a surface of said oxide film and said isolation layer; and etching back said oxide layer to a planarize surface.

13. The method according to claim 12, wherein a depth of said n-type silicon layer is about 0.5 to 4 $\mu$m.

14. The method according to claim 12, wherein said n-type silicon layer is doped phosphorous ions at an energy between about 150 KeV to 3 MeV, at a dose between about 1e12 to 5e13 atoms/cm$^2$.

15. The method according to claim 12, wherein said field oxide layer is formed by a high temperature steam oxidation process.

16. The method according to claim 12, wherein a thickness of said field oxide layer is about 2000 to 10000 Å.

17. The method according to claim 12, wherein said implanted damages are recovered by using rapid thermal processing.

18. The method according to claim 12, wherein said buried dopant layer is doped boron ions at an energy between about 150 KeV to 3 MeV, at a dose between about 5e11 to 1e15 atoms/cm$^2$.

19. The method according to claim 12, wherein said anodization process applies a diluted HF or a buffered-oxide-etching solution to convert said buried dopant layer to be a buried porous silicon layer.

20. The method according to claim 12, wherein said oxide layer is formed by using a chemical vapor deposition process.

* * * * *